(12) United States Patent
Chen et al.

(10) Patent No.: US 10,090,361 B2
(45) Date of Patent: Oct. 2, 2018

(54) EDGE-TO-EDGE MOBILE TERMINAL

(71) Applicant: EverDisplay Optronics (Shanghai) Limited, Shanghai (CN)

(72) Inventors: Jr Hong Chen, Shanghai (CN); Chien Er Huang, Shanghai (CN); Xinye Pan, Shanghai (CN); Huanyu Huang, Shanghai (CN); Tsunglin Yang, Shanghai (CN); Junjun Chen, Shanghai (CN)

(73) Assignee: EVERDISPLAY OPTRONICS (SHANGHAI) LIMITED, Shanghai (CN)

(*) Notice: Subject to any disclaimer, the term of this patent is extended or adjusted under 35 U.S.C. 154(b) by 0 days.

(21) Appl. No.: 15/682,058

(22) Filed: Aug. 21, 2017

(65) Prior Publication Data
US 2017/0345876 A1   Nov. 30, 2017

Related U.S. Application Data

(63) Continuation-in-part of application No. 15/166,554, filed on May 27, 2016, now Pat. No. 9,749,450.

(60) Provisional application No. 62/174,636, filed on Jun. 12, 2015.

(30) Foreign Application Priority Data

Mar. 16, 2017   (CN) .......................... 2017 1 0156054

(51) Int. Cl.
| H04M 1/00 | (2006.01) |
| H04B 1/38 | (2015.01) |
| H01L 27/32 | (2006.01) |

(52) U.S. Cl.
CPC .............................. *H01L 27/3202* (2013.01)

(58) Field of Classification Search
None
See application file for complete search history.

(56) References Cited

U.S. PATENT DOCUMENTS

| 8,334,863 B2 * | 12/2012 | Nathan ............... H01L 27/3227 |
| | | 136/243 |
| 9,075,612 B2 * | 7/2015 | Yang ..................... G06F 1/3262 |
| 9,298,220 B2 * | 3/2016 | Choi ..................... G06F 1/1626 |
| 9,342,105 B2 * | 5/2016 | Choi ..................... G06F 1/1637 |

(Continued)

FOREIGN PATENT DOCUMENTS

| CN | 103841222 A | 6/2014 |
| CN | 104601757 A | 5/2015 |

*Primary Examiner* — Tuan A Tran
(74) *Attorney, Agent, or Firm* — Andrew F. Young, Esq.; Lackenbach Siegel, LLP

(57) ABSTRACT

The present invention discloses a mobile terminal, comprising a bottom frame; a glass cover; a screen module covering the bottom frame; wherein the glass cover covers the screen module and two edges of both sides of the glass cover connect to the bottom frame; both the screen module and the glass cover have an arch opposite to the bottom frame; two edges of both sides of the screen module extend over both sides of the glass cover and are covered by the bottom frame. The beneficial effect of the above technical solution is: by utilizing the arch of the screen module and the glass cover opposite to the bottom frame, the front surface of the screen module and two sides of screen module do not have black edge, so that the display effect is excellent.

14 Claims, 6 Drawing Sheets

(56) References Cited

U.S. PATENT DOCUMENTS

| | | | | |
|---|---|---|---|---|
| 9,480,174 | B2* | 10/2016 | Park | G06F 1/1652 |
| 9,509,359 | B2* | 11/2016 | Michino | G06F 1/1637 |
| 9,674,922 | B2* | 6/2017 | Malon | H05B 33/22 |
| 2010/0073593 | A1* | 3/2010 | Sasaki | B29D 11/00 |
| | | | | 349/58 |
| 2011/0253835 | A1 | 10/2011 | Cook et al. | |
| 2012/0139821 | A1* | 6/2012 | Kim | H01L 51/5253 |
| | | | | 345/76 |
| 2012/0299850 | A1* | 11/2012 | Lee | G06F 3/0412 |
| | | | | 345/173 |
| 2014/0267090 | A1 | 9/2014 | Heyman et al. | |
| 2015/0123984 | A1* | 5/2015 | Kim | G01K 1/20 |
| | | | | 345/589 |
| 2015/0253835 | A1* | 9/2015 | Yu | G06F 1/3206 |
| | | | | 713/323 |

* cited by examiner

EDGE-TO-EDGE MOBILE TERMINAL

CROSS-REFERENCE TO RELATED APPLICATIONS

The present application is a continuation-in-part application of application Ser. No. 15/166,554 filed on May 27, 2016, and claims priority to and the benefit of U.S. Provisional Application No. 62/174,636, filed on Jun. 12, 2015, the entire content of which is incorporated herein by reference.

This application also claims priority to and benefit of Chinese Application No. CN 201710156054.0 filed Mar. 16, 2017, the entire contents of which are incorporated herein by reference.

BACKGROUND OF THE INVENTION

1. Field of the Invention

The invention relates to the field of flat panel display devices, more specifically, to a mobile terminal.

2. Description of the Related Art

Nowadays, the improvement of science and the advent of the information age make the development of the mobile communication terminal equipments, such as the mobile phones, become faster, especially the popularity of touch screen mobile phones brought by Apple Inc makes smartphones become one of the things to be carried on for people's daily life.

In order to make the appearance of smartphones more beautiful, the screen made by many mobile manufacturers becomes more "narrow"; however, to implement the convenience of operation of mobile phones, the present mobile phones only remove the border on two sides of the phone, however the top and bottom ends of the phone still need an reserve area to configure the handset and/or physical buttons (such as the home key), therefore the narrow edge effect of the entire mobile surface cannot be achieved.

FIG. 1 is a schematic view of the structure of the traditional smartphones; as shown in FIG. 1, due to the operating habits of traditional users and convenience of operation, the display area 11 of the mobile phone 1 can only be expanded in the X direction to achieve narrow edge on two sides of the border, and due to the requirement of configuring the handset 12 in top area 14 and physical buttons (such as the home key) 13 in bottom area 15 of the mobile phone 1, the display area 11 cannot be expanded in the Y direction.

With the improvement of quality of life, a variety of mobile terminals becomes a favorite device of human beings. Especially, the mobile terminal with large-screen, high-resolution display is particularly popular. Because the user's demand to the display is increased, more new technology, such as OLED (Organic Light-Emitting Diode) display technology, is introduced into the mobile terminal display. Because of its self-luminous, wide viewing angle, high contrast, low power consumption, ultra-high reaction speed, convenient for flexible display, etc., the OLED display has gradually become the mainstream of the mobile terminal display.

In the prior art, the OLED display panel has a non-displayable area around the panel caused by the encapsulation, that is, the black edge. The flexible curved screen technology and the curved glass panel can improve the black edge of the front of the screen partly. However, when the user sees the flexible curved screen from a side, it is easy to find there are still black edges on both sides of the flexible curved screen, resulting in the obvious defects in the display effect when viewing from the side.

SUMMARY OF THE INVENTION

In view of the above-mentioned problems, this application provides a smartphone, and the smartphone comprising:

a back shell, having a groove structure;

a circuit board, embedded in the groove structure of the back shell;

a screen module, electrically connected to the circuit board, and located above the circuit board;

a transparent cover plate, configured to seal an open end of the groove structure to form a closed space area containing the circuit board and the screen module, and having a cover area parallel to the screen module; wherein the transparent cover plate is flush with the back shell at their edges;

a light emitted by the screen module penetrates through the transparent cover plate to form a first display area, and a ratio of area of the first display area to the cover area of the transparent cover plate R is no less than 0.9;

the screen module is a flexible AMOLED display module; the flexible AMOLED display module has a flat surface and two flexible surfaces at two longitudinal sides of the flat surface;

the flat surface is attached closely to the transparent cover plate and forms the first display area;

the two flexible surfaces are attached closely to junctions of the transparent cover plate and back shell, and are extended downwards along two side walls of the back shell.

As a preferred embodiment, in the above-mentioned smartphone:

the screen module is a liquid crystal display module.

As a preferred embodiment, the above-mentioned smartphone further comprises a handset, and the handset is configured in the groove structure and aligned to one side edge of the back shell.

As a preferred embodiment, in the above-mentioned smartphone:

the smartphone has a front side provided with the first display area and a back side opposite to the front side, and a top side, a bottom side and vertical sides are configured between the front side and the back side; and the handset is selectively exposed to the front side of the first display area, the top side or the vertical sides adjacent to the position of the top side.

As a preferred embodiment, in the above-mentioned smartphone:

when the handset is exposed to the front side of the first display area, the transparent cover plate comprises a short corner or an opening, and the handset is exposed through the short corner or the opening.

As a preferred embodiment, in the above-mentioned smartphone:

the flexible AMOLED display module has a flexible surface at the top side and/or the bottom side.

As a preferred embodiment, the above-mentioned smartphone further comprises:

a radio module, configured on the bottom side or on the vertical sides adjacent to the position of the bottom side in relative to the handset.

As a preferred embodiment, the above-mentioned smartphone further comprises:

a camera module, configured on any side except for the front side of the smartphone.

As a preferred embodiment, the above-mentioned smartphone further comprises:

a camera module, configured on the back side of the smartphone.

As a preferred embodiment, in the above-mentioned smartphone:

a second display area is formed on the back side of the smartphone.

As a preferred embodiment, in the above-mentioned smartphone:

the resolution of the second display area is no greater than that of the first display area.

As a preferred embodiment, in the above-mentioned smartphone:

a type of the second display area selected from a group consisting of AMOLED screen, LCD display and electronic paper display.

In view of the above mentioned problems in the prior art, there is provided a mobile terminal which intends to improve the black edge of two sides of the display screen. The technical solution is as follows:

an edge-to-edge mobile terminal, comprising:
a bottom frame;
a glass cover;
a screen module covering the bottom frame;
wherein the glass cover covers the screen module and two edges of both sides of the glass cover connect to the bottom frame;
both the screen module and the glass cover have an arch opposite to the bottom frame;
two edges of both sides of the screen module extend over both sides of the glass cover and are covered by the bottom frame.

The above mobile terminal, further comprising:
a circuit board arranged in a space generated by arching of the screen module, the bottom frame covering the space;

The above mobile terminal, further comprising:
a middle frame by which the circuit board is fixed in the space.

The above mobile terminal, wherein the screen module comprises a touch panel and a display screen, the display screen covers the touch panel.

The above mobile terminal, wherein the bottom frame is provided with at least one groove, two edges of both sides of the touch panel and two edges of both sides of the display screen extend into the at least one groove respectively.

The above mobile terminal, wherein the two edges of both sides of the screen module have an inward first bend respectively.

The above mobile terminal, wherein the first bend has a bending angle belonging to (0°, 180°].

The above mobile terminal, wherein the bending angle of the first bend is 90°, a bottom of the screen module which is at an outside of the first bend is flush with bottoms of both sides of the glass cover.

The above mobile terminal, wherein the screen module and two sides of the glass cover are bent to form the arch.

The above mobile terminal, wherein the display screen is a flexible display device, and bending on both sides of the screen module is achieved by bending the flexible display device.

The above mobile terminal, wherein the flexible display device is an AMOLED display device.

The above mobile terminal, wherein the arch is formed by second bends at both sides of the screen module and the glass cover.

The above mobile terminal, wherein each of the second bends has a bending angle belonging to [200, 90°].

The above mobile terminal, wherein both sides of the bottom frame have an upward flanges respectively, the glass cover is connected to the flange.

The above mobile terminal, wherein the flange has an outside wall with a flat surface, and outside of the glass cover is flush with the outside wall.

The above technical solution has the following beneficial effects:

The smartphone described in this application extends the display area (namely touch operation area) of the mobile phone to the entire front surface of the mobile phone by configuring structures such as the handset and the physical buttons of the mobile phone on the side or the back side of the phone body, to realize full-screen display without borders, and to enhance the beauty of the appearance of the smartphone, thus to effectively improve the user experience.

By utilizing the arch of the screen module and the glass cover opposite to the bottom frame, the front surface of the screen module and two sides of screen module do not have black edge, so that the display effect is excellent.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
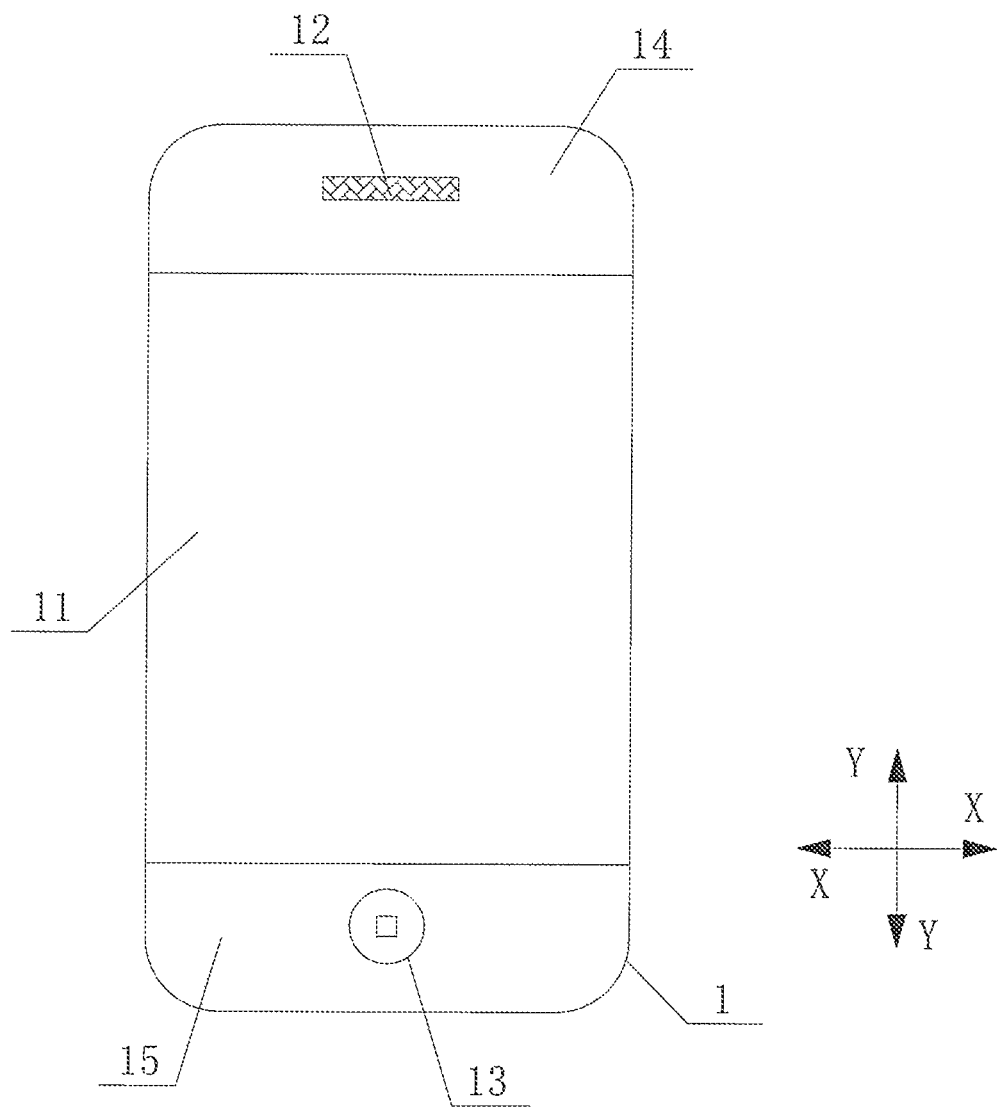
FIG. 1 is a structural diagram for a traditional smartphone.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The smartphone provided in the embodiment of the invention moves the structures such as the handset, the radio module and the physical buttons which are configured on the front surface of the mobile phone presently to the side of the phone, namely the front side of the phone is used only for the display area, and so that the display area be able to extend to the entire front surface of the mobile phone, to effectively enhance the beauty of appearance of the mobile phone, and meanwhile to improve the user experience.

Hereinafter, the smartphone of the invention will be described in detail with reference to accompanying drawings and exemplary embodiments.

Figure 2:
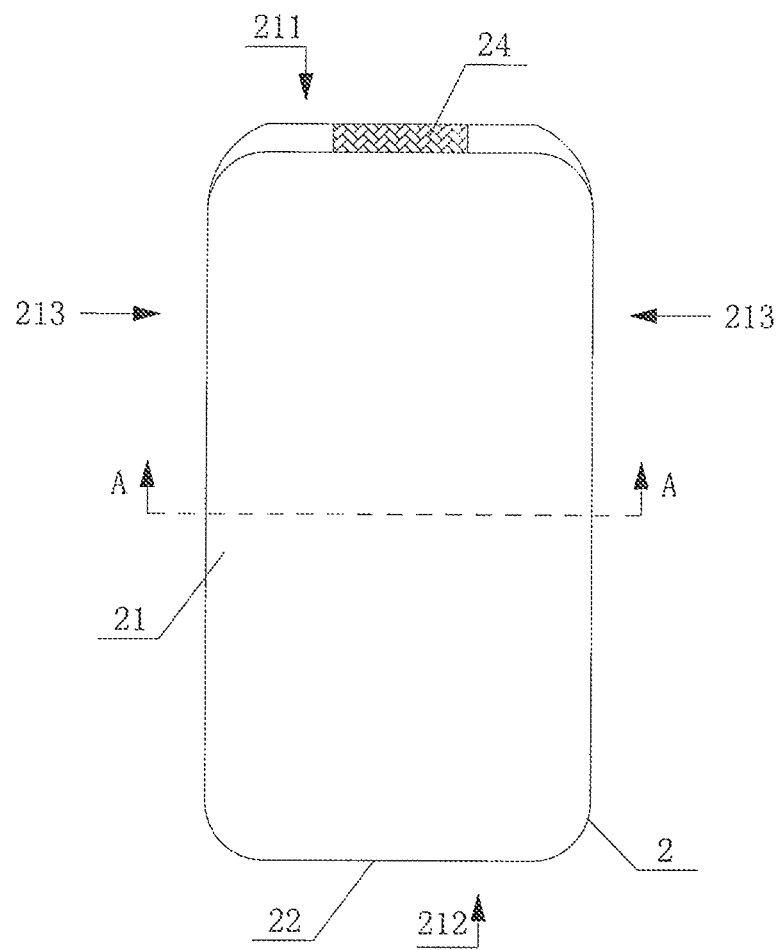
FIG. 2 is a structural diagram for the smartphone of the invention.
Figure 3:
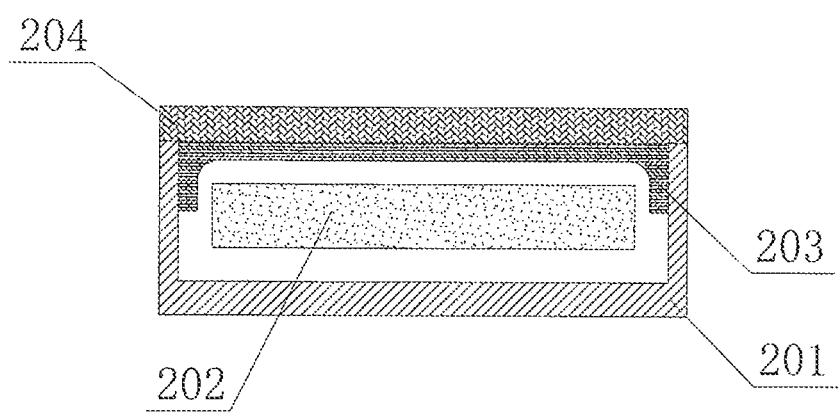
FIG. 3 is a cutaway diagram of FIG. 2 at A-A.

FIG. 2 is a structural diagram for the smartphone of the application, FIG. 3 is a cutaway diagram of FIG. 2 at A-A.

As shown in FIG. 2, a smartphone of this embodiment comprises a phone body 2, the phone body 2 has a front side (not marked in the figure, can be understood as a side surface of the phone body 2 facing the readers) for configuring the first display area (namely the main operating touch area of mobile phone) and a back side (not marked in the figure, can be understood as a side surface back of the phone body 2 opposite to the readers) opposite to the front side, and a top side 211, a bottom side 212 and vertical sides 213 on two sides are configured between the front side and the back side (namely the side of the phone body 2) of the phone body 2.

Further, as shown in FIG. 3, the above-mentioned phone body 2 comprises a back shell 201 having a groove structure, a circuit board 202, a screen module 203 and a transparent cover plate 204, both the circuit board 202 and the screen module 203 can be put into the above-mentioned groove structure, and the circuit board 202 is connected to the screen module 203 to drive the screen module 203 to shine for forming the display area; and the transparent cover plate 204 covers on the back shell 201 to seal the groove structure and to form a closed space area for containing and protecting the circuit board 202 and the screen module 203, and the light emitted by the screen module 203 penetrates through the transparent cover plate 204 to form a first display area 21 on the front surface of the phone body 2, the first display area 21 can be used for the touch screen or the main screen in multi-screens of the phone body 2.

Preferably, a ratio of area of the above-mentioned first display area 21 to the surface (the surface used to cover) of the cover area of the transparent cover plate 204 R is no less than 0.9, such as the R is 0.9, 0.92, 0.95 or 0.98, and even may be equal to 1.

Preferably, the above-mentioned screen module 203 may be a liquid crystal display module or an AMOLED display module, such as a flexible AMOLED display module, etc.; accordingly, the sides of the phone body 2, such as the top side 211 and/or the bottom side 212 and/or the vertical side 213, can be provided with flexible sides, to form the side display area.

Further, the above-mentioned phone body 2 also comprises a handset (not marked in figure) configured in the side, namely the handset can be configured in the groove structure and aligned to any one side edge (such as the top side, the bottom side and the vertical side location, etc.) of the back shell 201; in addition, the above-mentioned handset is selectively exposed to the front side the first display area 21, the top side or the vertical sides, and is configured near the position of the top side, for example, when the handset is configured on the vertical sides 213, the handset is configured near the top side 211, and is exposed to the front area of the first display area through an short angle or an opening configured on the transparent cover plate, so that the users can hear the sound played by the handset.

Preferably, the above-mentioned handset may comprise a handset module (not shown) and openings (not shown), and the handset module is configured in the back shell 201 (such as in the above-mentioned groove structure), the openings can be through-holes configured on the transparent cover plate 204 or through-holes formed by the gap on the transparent cover plate 204 together with the back shell 201, to penetrate the transparent cover plate 204, to transmit the sound played by the handset module to the outside of the phone body 2, so that the users hear the sound.

Further, the above-mentioned phone body 2 further comprises a radio module (not shown), the radio module is configured to the position in relative to the above-mentioned receiver module, for example, the radio module is configured to the position in relative to the receiver module on the bottom side 212 of the phone body 2, or the vertical sides 213 adjacent to the bottom side 212, so as to collect the user's voice.

Preferably, based on the openings in the above-mentioned handset, the back shell 201 and the transparent cover plate 204 are also provided with openings for transmitting voice in relative to the receiver module, the structure of the openings can be equal or approximate to the openings of the handset, and they may also be formed by any known way.

Further, the above-mentioned phone body 2 also comprises a camera module (not shown) which is configured on any other surfaces of the phone body 2 except the front side, namely the front side of the phone body 2 is not provided with a front camera.

Preferably, the camera module can be configured on the back side of the phone body 2, and a second display area (not shown in figure) is formed on the back side, namely the phone body 2 is a multi-screen smartphone; and the second display area can be displayed by one or more of the AMOLED screen, LCD display, electronic paper display, etc., namely a single display or multiple displays can be configured on the second display area, and can be configured according to the requirement.

Preferably, the above-mentioned second display area can be used as self-timer for users, the resolution of the second display area is no greater than that of the first display area.

In summary, in the above-mentioned embodiment of the invention, the necessary structures such as the handset are configured on the side or the back side of the mobile phone (aligning to the edges of the mobile phone), and the unnecessary structures such as physical buttons (e.g., home key, volume key, etc.), front-facing camera are removed, so that the entire front surface of the mobile phone can be used to form the display area to realize the full-screen display without borders, and to enhance the beauty of the appearance of the smartphone, thus to effectively improve the user experience.

The present application also discloses a mobile terminal and a method for producing the same, and the present invention will be described in further detail with reference to the accompanying drawings.

Embodiment I

Because the flexible curved screen does not improve a lot for the black edge, when the user looks the flexible curved screen from a side, it is easy to find there are still black edges on both sides of the flexible curved screen, resulting in the obvious defects for the display effect of viewing from the side.

Figure 4:
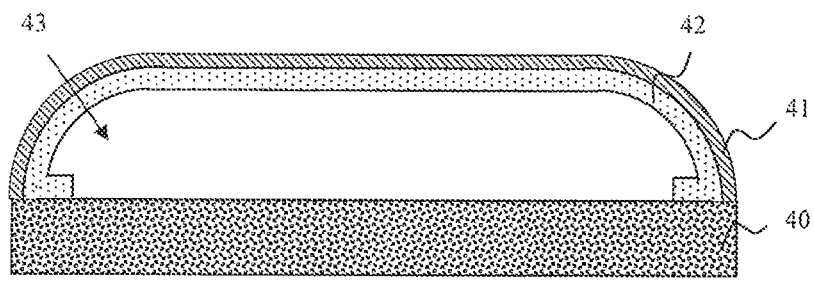
FIG. 4 is a structural diagram of a mobile terminal in an embodiment of the present invention.

Referring to FIG. 4, the embodiment discloses an edge-to-edge mobile terminal, comprising:
a bottom frame 40;
a glass cover 41;
a screen module 42 covering the bottom frame 4;
wherein the glass cover 41 covers the screen module 42 and two edges of both sides of the glass cover 41 connect to the bottom frame 40;
both the screen module 42 and the glass cover 41 have an arch opposite to the bottom frame 40;
two edges of both sides of the screen module 42 extend over both sides of the glass cover 41 and are covered by the bottom frame 40.

In the above technical solution, both the screen module 42 and the glass cover 41 have an arch opposite to the bottom frame 40, so that neither the front surface of the screen module 42 nor the two side surfaces of the screen module 42 have black edges; the front surface and side surface may be smooth so as to minimize the interference of the arch affecting the display effect.

As an alternative embodiment, the arch of the screen module 42 opposite to the bottom frame 40 and the arch of the glass cover opposite to the bottom frame 40 is arranged not only in the lateral section of the mobile terminal but also in the longitudinal section of the mobile terminal.

As an alternative embodiment, the mobile terminal may be a device such as a mobile phone, a tablet computer, a media player, a data acquisition device, or the like.

Referring to FIG. 4, in a preferred embodiment, the mobile terminal further comprising:
a circuit board arranged in a space generated by arching of the screen module, the bottom frame covering the space.

In the above technical solution, compared to the display panel in which the circuit board is arranged in the bottom frame, the bottom frame 40 of the present invention has a small advantage that the thickness of the bottom frame 40 is small, the black edge is improved by the arch, and total thickness of the display panel will not be increased.

Figure 5:
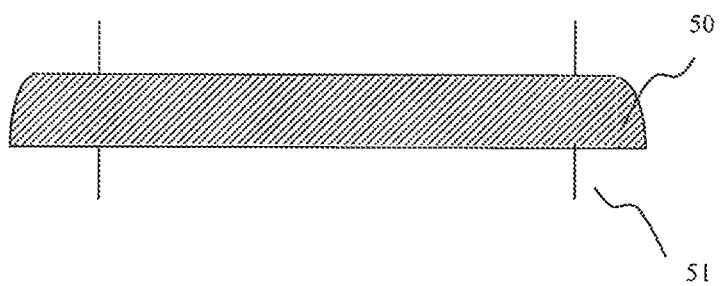
FIG. 5 is a structural diagram of a middle frame in an embodiment of the present invention.

Referring to FIG. 5, in a preferred embodiment, the mobile terminal further comprising:
a middle frame 50 by which the circuit board is fixed in the space 43.

In the above technical solution, the middle frame 50 may be provided with a matching design 51 as shown in FIG. 5, the matching design 51 is used to match the circuit board so that the circuit board is positioned and mounted in the middle frame 50 accurately and rapidly; the matching design 51 may be a rod-like positioning structure, a groove or other auxiliary assembly structure.

Embodiment II

Figure 6:
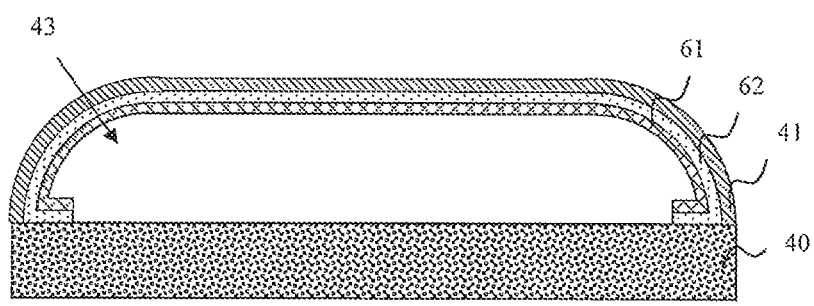
FIG. 6 is a structural diagram of a mobile terminal in an embodiment of the present invention.

Referring to FIG. 6, in a preferred embodiment, the screen module 42 comprises a touch panel 61 and a display screen 62, the display screen covers the touch panel.

Figure 7:
FIG. 7 is a structural diagram of a bottom frame in an embodiment of the present invention.
Figure 8:
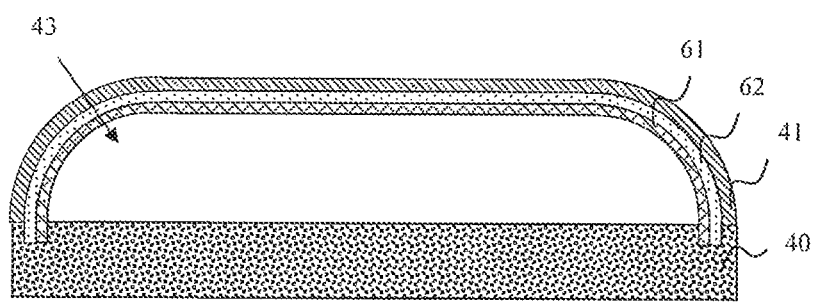
FIG. 8 is a structural diagram of a mobile terminal in an embodiment of the present invention.

In the above technical solution, the touch panel 61 and the display screen 62 are only a preferable embodiment, and the situation that the screen module 42 is a single layer structure or other composite structure is not excluded Referring to FIG. 7 and FIG. 8, in a preferred embodiment, the bottom frame 40 is provided with at least one groove 71, two edges of both sides of the touch panel 61 and two edges of both sides of the display screen 62 extend into the at least one groove 71 respectively In the above technical solution, the two edges extended from both sides of the touch panel 61 and the display screen 62 are buried in the groove 71 of the bottom frame 40, so as to avoid the other ways of increasing the thickness of the display panel, thereby the thickness of the display panel is reduced, and the deformation of the bottom frame 40 caused by the force of the touch panel 61 and the display screen 62 acting directly on the bottom frame 40 is avoided.

Embodiment III

Figure 9:
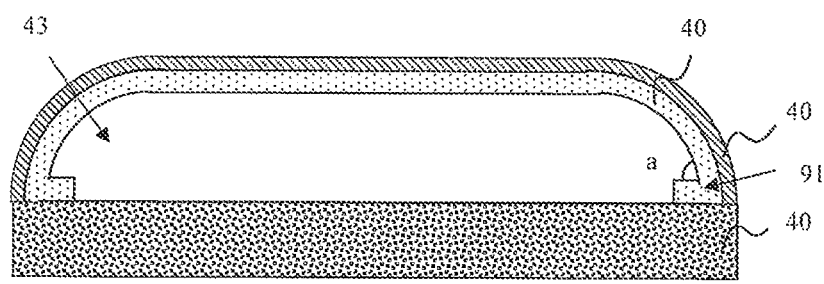
FIG. 9 is a structural diagram of a mobile terminal in an embodiment of the present invention.

Referring to FIG. 9, in a preferred embodiment, the two edges of both sides of the screen module 42 have an inward first bend 91 respectively.

In the above technical solution, the extended screen module 42 is directed inward by the first bend 91, the situation that the first bend is extended in a direction along the thickness of the mobile terminal is avoided.

As a preferred embodiment, the first bend has a bending angle a belonging to (00, 180°].

As a preferred embodiment, the bending angle of the first bend is 90°, a bottom of the screen module 42 which is at an outside of the first bend 91 is flush with bottoms of both sides of the glass cover 41.

In the above technical solution, the bottom which is outside of the bend 91 and the bottoms of both sides of the glass cover 41 can be smoothly engaged with the upper surface of the bottom frame 40, so as to improve the reliability of the package.

Referring to FIG. 9, in a preferred embodiment, the screen module 42 and two sides of the glass cover 41 are bent to form the arch.

As a preferred embodiment, the display screen 62 is a flexible display device, and bending on both sides of the screen module 42 is achieved by bending the flexible display device.

As a preferred embodiment, the flexible display device is an AMOLED display device.

Embodiment IV

Figure 10:
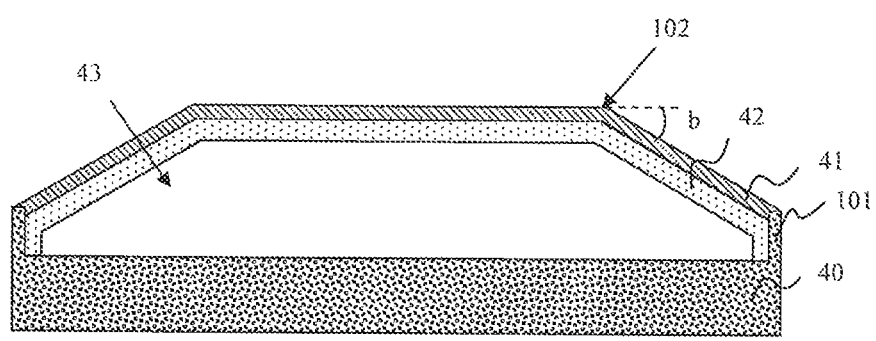
FIG. 10 is a structural diagram of a mobile terminal in an embodiment of the present invention.

Referring to FIG. 10, in a preferred embodiment, the arch is formed by second bends at both sides of the screen module 42 and the glass cover 41.

As a preferred embodiment, each of the second bends 102 has a bending angle b belonging to [20°, 90°].

In the above technical solution, by controlling the bending angle b and/or the bending initial position of the second bend 102, it is possible to control the extent and size to which the screen is arched and to reserve space for the installation of components such as the circuit board.

Referring to FIG. 10, in a preferred embodiment, both sides of the bottom frame 40 have an upward flanges 101 respectively, the glass cover 41 is connected to the flange 101.

In the above technical solution, the force applying to the bottom frame 40 is transferred to the flange 101 by setting the flange 101, so that the deformation of the bottom frame 10 caused by the force is avoided.

Referring to the dotted line of FIG. 10, in a preferred embodiment, the flange 101 has an outside wall with a flat surface, and outside of the glass cover 41 is flush with the outside wall, so that the situation that the width of the display panel is increased due to the outside of the glass cover 41 being extended out to the outside wall of the flange 101 is avoid.

The foregoing is only the preferred embodiments of the invention, not thus limiting embodiments and scope of the invention, those skilled in the art should be able to realize that the schemes obtained from the content of specification and figures of the invention are within the scope of the invention.

What is claimed is:

1. An edge-to-edge mobile terminal, comprising:
   a bottom frame;
   a glass cover;
   a screen module covering the bottom frame;
   wherein, the glass cover covers the screen module and two edges of both sides of the glass cover connect to the bottom frame;
   both the screen module and the glass cover have an arch opposite to the bottom frame;
   two edges of both sides of the screen module extend over both sides of the glass cover and are covered by the bottom frame;
   wherein the two edges of both sides of the screen module have an inward first bend respectively.

2. The mobile terminal according to claim 1, further comprising:
   a circuit board arranged in a space generated by arching of the screen module, the bottom frame covering the space.

3. The mobile terminal according to claim 2, further comprising:
   a middle frame by which the circuit board is fixed in the space.

4. The mobile terminal according to claim 1, wherein the screen module comprises a touch panel and a display screen, the display screen covers the touch panel.

5. The mobile terminal according to claim 4, wherein the bottom frame is provided with at least one groove, two edges of both sides of the touch panel and two edges of both sides of the display screen extend into the at least one groove respectively.

6. The mobile terminal according to claim 4, wherein the screen module and two sides of the glass cover are bent to form the arch.

7. The mobile terminal according to claim 6, wherein the display screen is a flexible display device, and bending on both sides of the screen module is achieved by bending the flexible display device.

8. The mobile terminal according to claim 7, wherein the flexible display device is an AMOLED display device.

9. The mobile terminal according to claim 1, wherein the first bend has a bending angle belonging to (0°, 180°].

10. The mobile terminal according to claim 9, wherein the bending angle of the first bend is 90°, a bottom of the screen module which is at an outside of the first bend is flush with bottoms of both sides of the glass cover.

11. The mobile terminal according to claim 1, wherein the arch is formed by second bends at both sides of the screen module and the glass cover.

12. The mobile terminal according to claim 11, wherein each of the second bends has a bending angle belonging to [20°, 90°].

13. The mobile terminal according to claim 1, wherein both sides of the bottom frame have an upward flange respectively, the glass cover is connected to the flange.

14. The mobile terminal according to claim 13, wherein the flange has an outside wall with a flat surface, and outside of the glass cover is flush with the outside wall.

* * * * *